United States Patent [19]
Nakajima et al.

[11] 4,112,290
[45] Sep. 5, 1978

[54] EVAPORATION VESSEL FOR USE IN VACUUM EVAPORATION

[75] Inventors: Yukihiko Nakajima, Machida; Shuzou Watanabe, Kawasaki; Akira Miyai, Machida; Masaji Ishii, Tokyo, all of Japan

[73] Assignee: Denki Kagaku Kogyo Kabushiki Kaisha, Tokyo, Japan

[21] Appl. No.: 736,169

[22] Filed: Oct. 27, 1976

[51] Int. Cl.² .................................. C23C 13/12
[52] U.S. Cl. .................................. 219/275; 219/541
[58] Field of Search .................. 219/271, 275, 541; 118/48, 49, 49.1; 338/318, 315, 333

[56] References Cited
U.S. PATENT DOCUMENTS

| 2,996,418 | 8/1961 | Bleil | 219/275 X |
| 3,281,517 | 10/1966 | Hemmer et al. | 219/275 X |
| 3,387,116 | 6/1968 | Dupuis | 338/318 X |
| 3,466,424 | 9/1969 | Adams | 219/275 |
| 3,514,575 | 5/1970 | Hall et al. | 219/275 |
| 3,537,886 | 11/1970 | Rively et al. | 219/275 X |
| 3,598,384 | 8/1971 | Zucchinelli | 219/275 X |
| 3,636,305 | 1/1972 | Passmore | 219/275 X |

Primary Examiner—C. L. Albritton
Attorney, Agent, or Firm—Stevens, Davis, Miller & Mosher

[57] ABSTRACT

An evaporation vessel for vacuum evaporation of electroconductive ceramic boat for use in the vacuum evaporation of a metallic or non-metallic substance by virtue of resistance heating, wherein the surface of the adjoining portion on the both sides of a cavity is lower than the top of the outside wall of the cavity.

8 Claims, 7 Drawing Figures

EVAPORATION VESSEL FOR USE IN VACUUM EVAPORATION

BACKGROUND OF THE INVENTION

This invention relates to an evaporation vessel of electroconductive ceramic substance having the shape of a boat and used for the vacuum evaporation of a metallic or non-metallic substance through resistance heating.

In the deposition of relatively large amounts of metallic or other substances by the vacuum evaporation method, boat-shaped evaporation vessels are generally used made of high-melting metals such as tungsten, tantalum and molybdenum or those made of electroconductive ceramic material introduced recently in the market.

FIG. 1 illustrates the conventional shape for a boat for evaporation vessels made of high-melting metals and FIG. 2 illustrates a conventional shape for evaporation vessels made of electroconductive ceramic material.

In the case of evaporation boats of these shapes, the molten metal in the course of vacuum evaporation may possibly creep out of the cavity portion denoted by the numeral 1 in FIG. 1 or in FIG. 2 to eventually reach the electrodes and, worse still, to result in the phenomenon of an undesirable formation of a short circuit. With a view to precluding such undesirable creeping of the molten metal, various devices have been proposed such as, for example, the insertion of notches at the portion adjoining the cavity (hereinafter referred to as the "limb portion") in tungsten boats. In one of the shapes of the electroconductive ceramic evaporation boats now available in the market, there has been adopted a device of forming the limb portion in a smaller thickness to raise the resistance as shown in FIG. 3 for thereby increasing the magnitude of heat generated at said limb portion and consequently preventing the molten metal from creeping up to the electrodes.

None of the devices so far proposed, however, have been able to completely eliminate the phenomenon of creeping of the molten metal out of the cavity portion. Even with the shape of the boat in FIG. 3, the molten metal can flow partially to the limb portion.

In the course of deposition, therefore, the resulting thickness in the deposited film is not uniform and the desired control of the film thickness is difficult to accomplish. Also in the case of repeated deposition, the distance over which the molten metal creeps out onto the limb portion is not consistent. For these reasons, evaporation boats of the shape being discussed cannot be used particularly where the deposited films are required to have a uniform thickness.

SUMMARY OF THE INVENTION

This invention aims to provide an evaporation vessel for vacuum evaporation which is free from the phenomenon of the possible creeping of the molten substance from the cavity portion and possessed of fixed directionality of evaporation, by using an electroconductive ceramic obtained by molding in a hot press a powdered material such as of a $TiB_2$—BN system, a $TiB_2$—B-N—AlN system, a $TiB_2$—BN—TiN system or a BN—$TiB_2$—AlN—Al system which has electroconductivity and corrosion resistance to the molten metal. This electroconductive ceramic may be of a type which is obtained from a powdered material having zirconium boride in place of $TiB_2$.

In the diagrams, 1 denotes a cavity, 2 a portion adjoining said cavity, 3 a recess disposed in said portion adjoining the cavity, $a$ the depth of the cavity, $b$ the distance from the top surface of the outside wall of the cavity to the surface of the portion adjoining the cavity, $c$ the thickness of the portion adjoining the cavity and $d$ the thickness of the base of the cavity respectively.

DETAILED DESCRIPTION OF THE INVENTION

The characteristics of the present invention are described below in detail with reference to an operation using, as the substance for deposition, aluminum which is particularly liable to entail the problem of creeping at the time of deposition.

Figure 1:
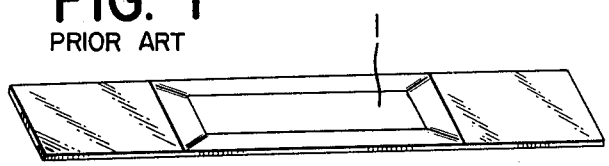
FIG. 1 shows an evaporation boat made of a high-melting metal.
Figure 2:
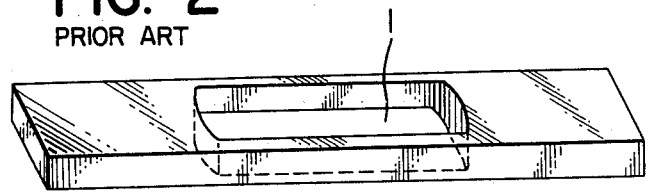
FIGS. 2 and 3 show evaporation boats each made of an electroconductive ceramic substance and FIGS. 4, 5, 6 and 7 each show typical shapes of evaporation boats according to the present invention.
Figure 3:
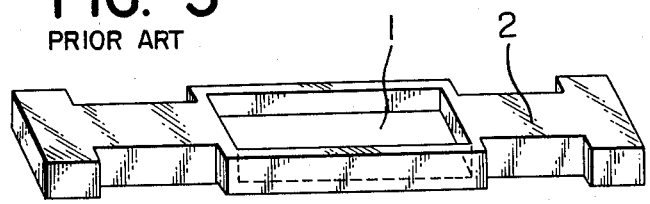
Figure 4:
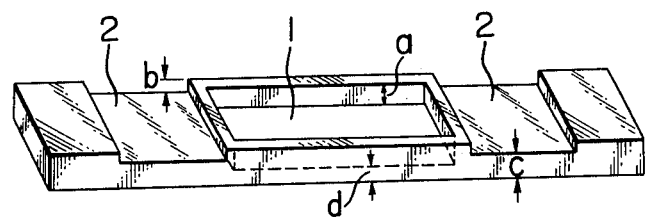

The evaporation vessel for vacuum evaporation of the present invention as shown in FIG. 4 has the surface of the limb portion 2 on both sides of the cavity 1, which is lower than the top of the outside wall of the cavity 1. It has the following advantages to provide the difference in level between the surface of the limb portion 2 and the top of the outside wall of the cavity 1.

Previously, the molten metal crept from the cavity and flowed on the surface of the limb portion 2 when the evaporation vessel did not have the difference in level described above, but the flow of the molten metal to the limb portion 2 is prohibited at the outside wall of the cavity 1 by surface tension of the molten metal when the evaporation vessel is provided with the difference in level.

Secondly, by providing the difference in level, the thickness of the limb portion 2 is naturally decreased and its sectional area becomes small, so that a characteristic resistance of this portion is increased and its temperature becomes high. Therefore, even if the molten metal flows over to the limb portion 2, the molten metal will be evaporated. And, as the molten metal creeps slowly in the form of waterdrops to the limb portion 2, it will be surely evaporated by the limb portion 2 of high temperature.

As described above, the present invention prohibits the creeping of the molten metal by utilizing the surface tension of the molten metal due to the difference in level. Accordingly, the angle between the outside wall of the cavity 1 and the surface of the limb portion 2 is preferable to be not more than 90°, and more suitably from 90° to 60°.

In the boat shown in FIG. 4, for example, the various dimensions such as, the depth "$a$" of the cavity, the distance "$b$" from the top of the outside wall of the cavity to the surface of the portion adjoining the cavity, the thickness "$c$" of the portion adjoining the cavity and the thickness "$d$" of the base of the cavity were varied in search of conditions under which the distance that the molten aluminum creep out of the cavity edge would be kept within 2 mm of the side of electrode.

EXAMPLE 1

A powdered material consisting of 28% by weight of AlN, 13% of BN, 51% of $TiB_2$ and 8% of Al was held in a hotpress molding machine at 2200° C. under pressure of 150 kg/cm² for 1 hour to produce bar-shaped molds. Boats of a shape as one shown in FIG. 4 were cut out of the bar-shaped molds. They each consisted of a cavity 1 for holding the molten metal and limb portions 2 each adjoining the cavity. Dimensionally, the boat width was 16 mm, the cavity width was 14 mm, the limb portion length was 20 mm and the electrode-to-electrode distance of 90 mm was fixed and the cavity length was selected so as to give the layer of molten aluminum a thickness of 1 mm.

As the test conditions for vacuum evaporation, the potential applied, the magnitude of electric current and the time of vacuum evaporation were selected within the respective ranges shown below.

(1) Amount of aluminum charged; 1.0 – 2.0 g
(2) Potential applied; 5 – 12 volts
(3) Magnitude of electric current; 100 – 500 amperes
(4) Cavity length; 30 – 50 mm
(5) Time of vacuum evaporation; 30 – 120 seconds The results are shown in Table 1.

Table 1

| Dimensions of boat (mm) | | | | Extent of creeping of molten aluminum from cavity | Thickness of aluminum layer while in molten state (mm) |
| a | b | c | d | | |
| --- | --- | --- | --- | --- | --- |
| 5 | 0 | * | * | X | |
| " | 1 | 4 | 2.5 | X | |
| " | 1 | 3 | 4 | O | |
| " | 1 | 3 | 2.0 | O | |
| " | 3 | 10 | 2.5 | X | |
| " | 3 | 9 | 2.0 | O | |
| 3 | 0 | * | * | X | 1 |
| " | 1 | 4 | 2.0 | X | |
| " | 1 | 3 | 1.5 | O | |
| " | 2 | 7 | 2.0 | X | |
| " | 2 | 6 | 1.5 | O | |
| 2 | * | * | * | X | |
| 1 | * | * | * | X | |

*Creeping of 2 mm or more occurring without reference to the dimension indicated.
O Creeping of less than 2 mm
X Creeping of more than 2 mm

EXAMPLE 2

A powdered material consisting of 37% by weight of AlN, 17% of BN and 46% of TiB₂ was held for 1 hour in a hot-press molding machine at 2200° C. under pressure of 150 kg/cm² to produce molds. Boats of a shape as shown in FIG. 4 were cut out of the molds. Dimensionally, the boat width was 8 mm, the cavity width was 6 mm, the limb portion length was 20 mm and the electrode-to-electrode distance of 90 mm was fixed and the cavity length was selected so as to give the layer of molten aluminum a thickness of 2 mm. The test conditions were identical with those of Example 1, except for those indicated below.

(1) Amount of aluminum charged; 0.1–1.0 g
(2) Cavity length; 20–50 mm

The results are shown in Table 2.

Table 2

| Dimensions of boat (mm) | | | | Extent of creeping of molten aluminum from cavity | Thickness of aluminium layer while in molten state (mm) |
| a | b | c | d | | |
| --- | --- | --- | --- | --- | --- |
| 6 | 0 | * | * | X | |
| " | 1 | 5 | 2.5 | X | |
| " | 1 | 3 | 1.5 | O | |
| " | 2 | 7 | 2.5 | X | 2 |
| " | 2 | 6 | 2.5 | O | |
| " | 2 | 4 | 1.5 | O | |
| 5 | * | * | * | X | |

*Creeping of 2 mm or more occurring without reference to the dimension indicated.
O Creeping of less than 2 mm
X Creeping of more than 2 mm The results of Tables 1 and 2 possibly lead to a logical inference that the demarcation as to whether or not the molten aluminum creeps out of the cavity is delicately affected by the temperature of the layer of molten aluminum and the temperature of the limb portion of the boat and that the essential requirements which the dimensions $a$, $b$, $c$ and $d$ (in mm) should fulfil are expressed, by using the thickness P of the layer of the molten aluminum as the parameter, collectively by the following formulas.

Formula (1); $a \geq 3P$
Formula (2); $b \geq 1$
Formula (3); $3 \leq c \leq 3b$ Although no limitations are specifically fixed on the thickness $d$ of the base of the cavity portion, it is nevertheless desirable for the thickness $d$ to be smaller than the thickness $c$ of the limb portion in view of advantages such as a reduction in the time required for vacuum evaporation.

The present invention has been described with reference to an operation using aluminum as an example. In addition to being capable of precluding otherwise possible creeping of the substance subjected to deposition from the cavity, the present invention is characterized by permitting the thickness of the deposited film of substance under vacuum evaporation to be distributed uniformly owing to the absence of the phenomenon of the molten metal's creeping, by enabling the vacuum evaporation to be performed with fixed directionality and also by the fact that since the substance under vacuum evaporation can be kept in its molten state within the cavity, suspended matters such as oxides which are present in the molten substance can be removed or otherwise handled with unusual ease.

Figure 5:
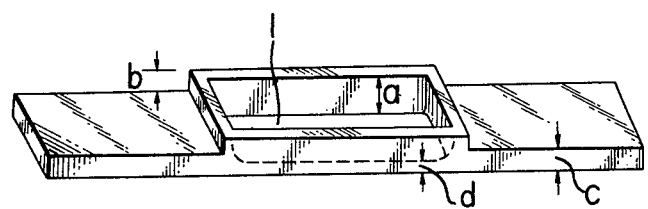
Figure 6:
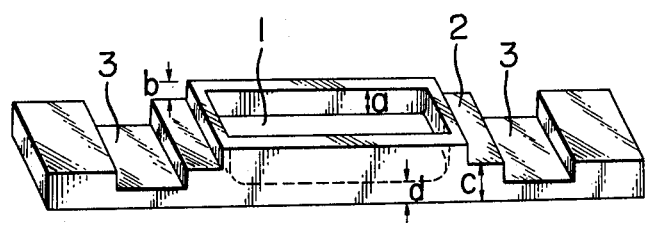
Figure 7:
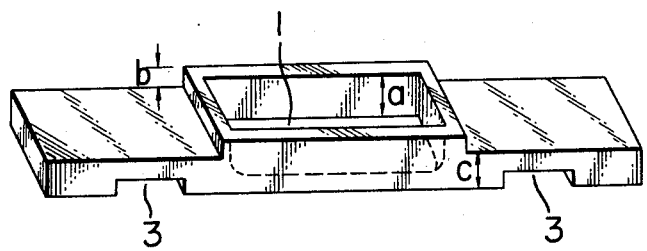

The evaporation vessel of the present invention has been described as possessing a shape like the one shown in FIG. 4 by way of example. The shape of the evaporation vessel, however, is not limited to that of FIG. 4. For example, an evaporation boat consisting of a cavity 1, portions 2 each adjoining said cavity 1 and recesses 3 disposed one each in said portions 2 adjoining the cavity as shown in FIG. 6 will suffice in so far as the dimensions thereof satisfy the requirements indicated by the aforementioned formulas (1), (2) and (3). The present invention is characterized by the fact that the evaporation vessel can be used effectively in any of the shapes (such as are shown by way of example in FIGS. 5 and 7) and the fact that the material of the evaporation boat is not limited to electroconductive ceramic substances alone, but graphite or other similar material can be used for said boat.

What is claimed is:

1. In an evaporation vessel solidly made of electroconductive ceramic for vacuum evaporation of a metallic or non-metallic substance by virtue of resistance heating generated by directly passing electric current through said evaporation vessel, the improvement wherein the surface of the adjoining portion on the both sides of a cavity through which electricity passes is lower than the top of the outside wall of said cavity for increasing the temperature in said adjoining portions due to a smaller cross-sectional area having an increased electrical resistance.

2. An improved evaporation vessel for vacuum evaporation as claimed in claim 1, wherein said outside wall of the cavity and said surface of the adjoining portion are at angles from 90° to 60°.

3. An improved evaporation vessel for vacuum evaporation as claimed in claim 1, wherein the thickness, $c$, in millimeters of said adjoining portions and the distance, $b$, in millimeters from the top of the outside wall of the cavity to the surface of the adjoining portions satisfy the expressions $b \geq 1$ and $3 \leq c \leq 3b$.

4. In a method for using an electroconductive ceramic boat evaporation vessel for the vacuum evaporation of a metallic or non-metallic substance by virtue of resistance heating, the improvement comprising employing a vessel having a central cavity surrounded by a wall and support portions adjoining said walls at opposite ends of the cavity having dimensions such that the thickness, $c$, in millimeters of the portions adjoining the opposite ends of the cavity thereof and the distance, $b$, in millimeters from the top of said wall of said cavity to the upper surface of the adjoining portions satisfy the expressions $b \geq 1$ and $3 \leq c \leq 3b$ and limiting the depth of the molten metal held inside the cavity to not more than one-third of the entire depth of the cavity.

5. An improved evaporation vessel for vacuum evaporation as claimed in claim 1, wherein the cross-sectional area of the adjoining portion on both sides of the cavity taken in a vertical plane perpendicular to a longitudinal axis connecting both sides is less than the cross-sectional area of the wall of said cavity taken in a parallel vertical plane.

6. An evaporation vessel for vacuum evaporation of a substance by electric resistance heating of the vessel comprising a central electrically conductive portion having a cavity surrounded by a wall;

electrically conductive support members on either side of said central portion having an upper surface attached to the walls on two opposite sides of the cavity at a position below the top of said walls and having terminal ends adapted for electrical connection, said support members further having at least a portion with a cross-sectional area along a vertical plane perpendicular to the length of the vessel which is less than the cross-sectional area of said walls along a parallel vertical plane, whereby upon passing electrical current through said support members the electrical resistance temperature is greater in said portions than at said wall.

7. An evaporation vessel according to claim 6, wherein the wall surrounding the cavity extends at least 1 millimeter above the upper surface of the adjacent support members and wherein the thickness of the adjacent support member expressed by $c$ in millimeters and the height of the wall above the surface of the adjacent support member expressed by $b$ in millimeters satisfies the relationship $3 \leq c \leq 3b$.

8. An evaporation vessel according to claim 7, wherein said support members have planar surfaces.

* * * * *